(12) United States Patent
Ju et al.

(10) Patent No.: US 10,547,130 B2
(45) Date of Patent: Jan. 28, 2020

(54) ELECTRICAL CONNECTOR HAVING PROTRUDING PORTIONS ON METAL SHELL

(71) Applicant: LOTES CO., LTD, Keelung (TW)

(72) Inventors: Ted Ju, Keelung (TW); Zuo Feng Jin, Keelung (TW)

(73) Assignee: LOTES CO., LTD, Keelung (TW)

( * ) Notice: Subject to any disclaimer, the term of this patent is extended or adjusted under 35 U.S.C. 154(b) by 0 days.

(21) Appl. No.: 16/205,414

(22) Filed: Nov. 30, 2018

(65) Prior Publication Data

US 2019/0173206 A1    Jun. 6, 2019

(30) Foreign Application Priority Data

Dec. 1, 2017   (CN) .................... 2017 2 1652834 U (51) Int. Cl.
*H01R 13/40*    (2006.01)
*H01R 13/46*    (2006.01)
*H01R 13/24*    (2006.01)
*H01R 12/71*    (2011.01)
(Continued)

(52) U.S. Cl.
CPC ....... *H01R 12/712* (2013.01); *H01R 12/7005* (2013.01); *H01R 12/716* (2013.01); *H01R 13/2442* (2013.01); *H01R 13/40* (2013.01); *H01R 13/46* (2013.01); *H05K 7/1069* (2013.01)

(58) Field of Classification Search
CPC .. H01R 12/712; H01R 12/7005; H01R 13/40; H01R 13/46; H01R 13/2442
See application file for complete search history.

(56) References Cited

U.S. PATENT DOCUMENTS

| | | | |
|---|---|---|---|
| 8,708,716 B1* | 4/2014 | Ho ................. | H01R 12/714 439/83 |
| 8,858,241 B2* | 10/2014 | Cheng ............. | B23K 1/0016 439/83 |
| 9,806,444 B1* | 10/2017 | Ju ................... | H01R 12/585 |

(Continued)

FOREIGN PATENT DOCUMENTS

| | | |
|---|---|---|
| CN | 201112752 Y | 9/2008 |
| CN | 202564628 U | 11/2012 |

*Primary Examiner* — Edwin A. Leon
*Assistant Examiner* — Milagros Jeancharles
(74) *Attorney, Agent, or Firm* — Locke Lord LLP; Tim Tingkang Xia, Esq.

(57) ABSTRACT

An electrical connector is electrically connected to a chip module having multiple contact pads. The electrical connector includes an insulating body having multiple accommodating grooves. Multiple conductive terminals are respectively accommodated in the accommodating grooves. Each conductive terminal has a main body portion accommodated in a corresponding accommodating groove and an extending arm extending forward from an upper end of the main body portion. Each extending arm of the conductive terminals is used to be upward electrically connected to a corresponding contact pad. At least one supporting portion is provided on the insulating body and located at one side of a corresponding accommodating groove. A first guide portion protrudes and extends from a top end of the supporting portion to upward abut the chip module. A horizontal projection of the extending arm of at least one conductive terminal partially overlaps with a horizontal projection of the first guide portion.

17 Claims, 7 Drawing Sheets

(51) Int. Cl.
*H01R 12/70* (2011.01)
*H05K 7/10* (2006.01)

(56) References Cited

U.S. PATENT DOCUMENTS

| | | | | |
|---|---|---|---|---|
| 10,050,387 | B1* | 8/2018 | Wu | H01R 43/205 |
| 10,148,023 | B1* | 12/2018 | Ju | H01R 43/0256 |
| 10,236,635 | B2* | 3/2019 | Ju | H01R 13/6597 |
| 10,305,206 | B1* | 5/2019 | Huo | H01R 12/716 |
| 2012/0028502 | A1* | 2/2012 | Yeh | H01R 12/57 |
| | | | | 439/626 |
| 2012/0270451 | A1* | 10/2012 | Ju | H01R 12/714 |
| | | | | 439/709 |
| 2014/0080330 | A1* | 3/2014 | Chang | H01R 13/2442 |
| | | | | 439/83 |
| 2014/0179131 | A1* | 6/2014 | Liao | H01R 13/41 |
| | | | | 439/83 |
| 2014/0322974 | A1* | 10/2014 | Chang | H01R 13/6585 |
| | | | | 439/607.01 |
| 2018/0212347 | A1* | 7/2018 | Chang | H01R 12/716 |
| 2018/0316102 | A1* | 11/2018 | Ju | H01R 13/6581 |
| 2018/0331442 | A1* | 11/2018 | Huang | H01R 12/714 |
| 2019/0067837 | A1* | 2/2019 | Ju | H01R 4/02 |
| 2019/0173207 | A1* | 6/2019 | Ju | H01R 12/712 |

\* cited by examiner

ELECTRICAL CONNECTOR HAVING PROTRUDING PORTIONS ON METAL SHELL

CROSS-REFERENCE TO RELATED PATENT APPLICATION

This non-provisional application claims priority to and the benefit of, pursuant to 35 U.S.C. § 119(a), patent application Serial No. CN201721652834.6 filed in China on Dec. 1, 2017. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present application relates to an electrical connector, and more particularly to an electrical connector capable of guiding and aligning terminals.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

An existing electrical connector is used for electrically connecting a chip module to a circuit board, and electrically conducting the chip module in a pressing manner. The chip module is provided with contact pads for conducting the electrical connector. The electrical connector generally includes an insulating body and multiple conductive terminals accommodated in the insulating body. Each of the conductive terminals is provided with an elastic arm, and a contact portion electrically conducting the corresponding contact pad of the chip module is provided on the elastic arm. Each of the conductive terminals has better elasticity, and an external pressure needs to be applied to each conductive terminal through other components, such that each conductive terminal is elastically deformed and then in extrusion contact with the corresponding contact pad of the chip module by its elastic force, thereby achieving the electrical conduction between the conductive terminals and the chip module. Another end of each conductive terminal away from the chip module is electrically conducted with the circuit board, thereby achieving the electrical conduction between the chip module and the circuit board.

As the size of the existing electrical connector becomes smaller, the conductive terminals become denser. When the conductive terminals are assembled to the insulating body, some of the conductive terminals may not be assembled in place and may be tilted. Further, when the elastic arm is pressed by the chip module, the elastic arm may also be deflected. Due to the increasingly high density, it may cause two adjacent conductive terminals to contact each other, resulting in short circuiting.

Meanwhile, in the existing electrical connector, in order to prevent the chip module from excessively pressing the elastic arms downward to damage the conductive terminals, supporting portions may generally be provided on the electrical connector. When the elastic arms are pressed downward by the chip module to a certain extent, the chip module abut the supporting portions to prevent the conductive terminals from being excessively pressed. However, the elastic arms will be deflected during the pressing process to scrape the supporting portions, resulting in the damage to the conductive terminals.

Therefore, a heretofore unaddressed need to design an improved electrical connector exists in the art to address the aforementioned deficiencies and inadequacies.

SUMMARY

The present application is directed to an electrical connector in which multiple supporting portions are arranged on an insulating body, a first guide portion protrudes from each of the supporting portions, and the first guide portion is used for supporting the chip module; and meanwhile, the first guide portion may also align the deflected conductive terminals to prevent a short circuit between the two adjacent conductive terminals.

In order to achieve the foregoing objective, the present invention adopts the following technical solution:

An electrical connector is configured to be electrically connected to a chip module having a plurality of contact pads. The electrical connector includes: an insulating body, having a plurality of accommodating grooves in a front and rear arrangement; a plurality of conductive terminals, respectively accommodated in the accommodating grooves, wherein each of the conductive terminals has a main body portion accommodated in a corresponding one of the accommodating grooves and an extending arm extending forward from an upper end of the main body portion, and each of the extending arms of the conductive terminals is configured to be upward electrically connected to a corresponding one of the contact pads; and at least one supporting portion, provided on the insulating body and located at one side of a corresponding one of the accommodating grooves, wherein a first guide portion protrudes and extends from a top end of the supporting portion, and the first guide portion is configured to upward abut the chip module; wherein a horizontal projection of the extending arm of at least one of the conductive terminals partially overlaps with a horizontal projection of the first guide portion.

In certain embodiments, the first guide portion has a first guide surface obliquely provided, and a first included angle is formed between the first guide surface and a top surface of the insulating body.

In certain embodiments, the supporting portion includes a second guide portion laterally protrudes and extends therefrom, the second guide portion is located below the first guide portion, the second guide portion has a second guide surface obliquely provided, a second included angle is formed between the second guide surface and the top surface of the insulating body, and the first included angle is less than the second included angle.

In certain embodiments, a bottom end of the supporting portion is connected with the insulating body, the second guide portion and the first guide portion are provided from the bottom end to the top end of the supporting portion, and a width of the supporting portion gradually decreases from the bottom end toward the top end.

In certain embodiments, one end of the first guide surface away from the second guide surface is converged to an intersection point.

In certain embodiments, a vertical projection of the second guide surface partially overlaps with the extending arm.

In certain embodiments, one end of the extending arm away from the main body portion has a contact portion being arc-shaped, and the contact portion is configured to upward abut the corresponding one of the contact pads.

In certain embodiments, when the chip module presses the extending arm downward toward the insulating body, the corresponding one of the contact pads presses the contact portion downward until the chip module abuts a top surface of the first guide portion.

In certain embodiments, when the chip module presses the extending arm downward toward the insulating body, the first guide portion stops the extending arm from excessively moving laterally.

In certain embodiments, two fastening slots are concavely provided at two sides of each of the accommodating grooves respectively, two retaining portions are provided to extend upward from two sides of the main body portion respectively and are located at two sides of the extending arm, and the two retaining portions are correspondingly fastened in the two fastening slots.

Compared with the related art, the electrical connector according to certain embodiments of the present invention has the following beneficial effects:

The electrical connector is provided with multiple supporting portions on the insulating body, and each supporting portion is located at one side of one of the accommodating grooves. The first guide portion protrudes and extends from the top end of each supporting portion. The horizontal projection of the extending arm of each of some of the conductive terminals partially overlaps with the horizontal projection of the first guide portion. Thus, the first guide portion can support the chip module to prevent the chip module from excessively pressing the extending arms to damage the conductive terminals. Meanwhile, in the process that the chip module presses the extending arms, the first guide portion can align the tilted conductive terminals on the insulating body and the deflected conductive terminals occurred in the pressing process, so as to return the conductive terminals to the correct positions, thus preventing two adjacent conductive terminals from contacting each other to cause short circuiting.

These and other aspects of the present invention will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

The present invention is more particularly described in the following examples that are intended as illustrative only since numerous modifications and variations therein will be apparent to those skilled in the art. Various embodiments of the invention are now described in detail. Referring to the drawings, like numbers indicate like components throughout the views. As used in the description herein and throughout the claims that follow, the meaning of "a", "an", and "the" includes plural reference unless the context clearly dictates otherwise. Also, as used in the description herein and throughout the claims that follow, the meaning of "in" includes "in" and "on" unless the context clearly dictates otherwise. Moreover, titles or subtitles may be used in the specification for the convenience of a reader, which shall have no influence on the scope of the present invention.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items.

Furthermore, relative terms, such as "lower" or "bottom" and "upper" or "top," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower", can therefore, encompasses both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below.

As used herein, "around", "about" or "approximately" shall generally mean within 20 percent, preferably within 10 percent, and more preferably within 5 percent of a given value or range. Numerical quantities given herein are approximate, meaning that the term "around", "about" or "approximately" can be inferred if not expressly stated.

As used herein, the terms "comprising", "including", "carrying", "having", "containing", "involving", and the like are to be understood to be open-ended, i.e., to mean including but not limited to.

The description will be made as to the embodiments of the present invention in conjunction with the accompanying drawings in FIGS. 1-6. In accordance with the purposes of this invention, as embodied and broadly described herein, this invention, in one aspect, relates to an electrical connector.

Figure 1:
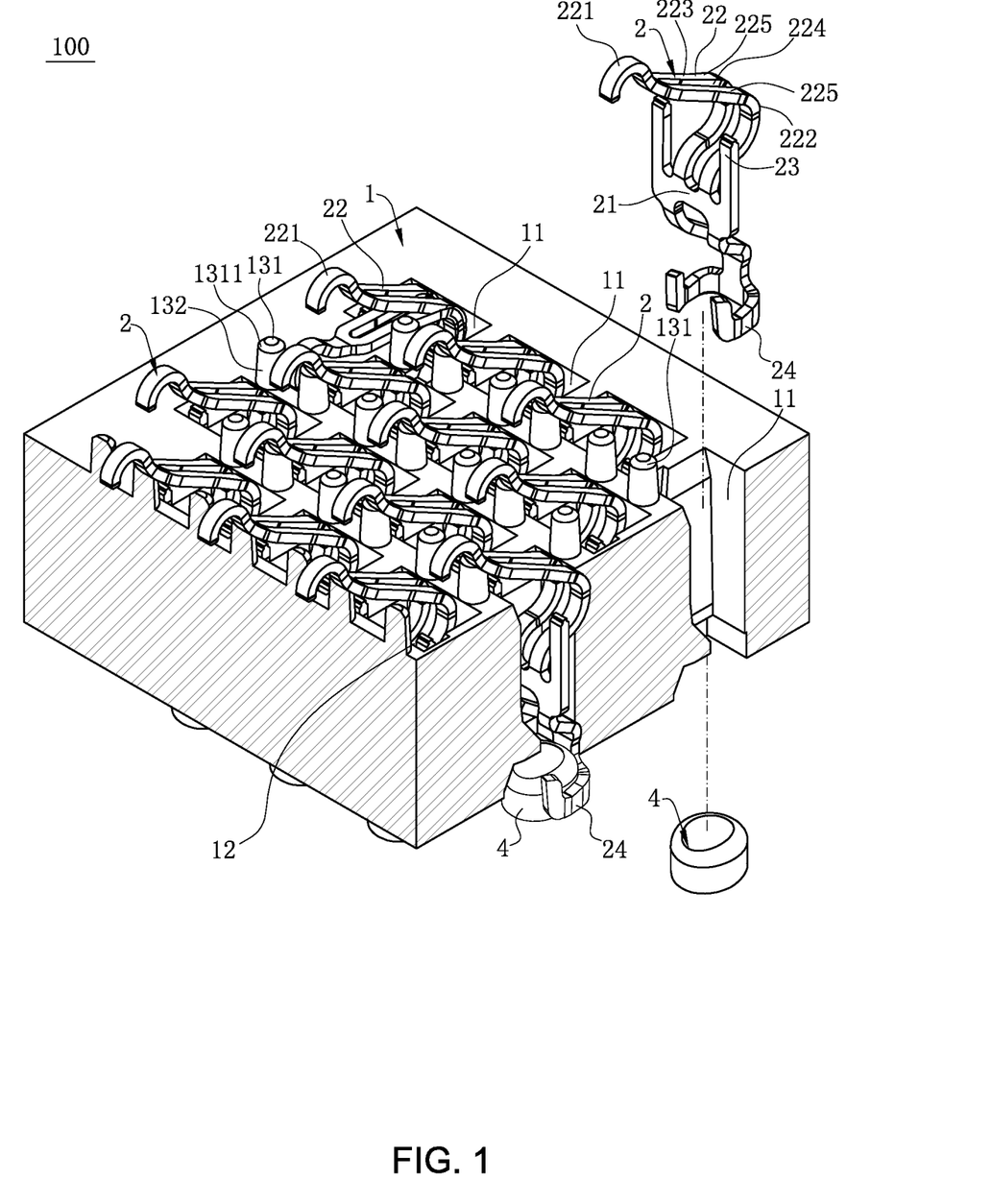
FIG. 1 is a perspective exploded view of an electrical connector according to certain embodiments of the present application.
Figure 5:
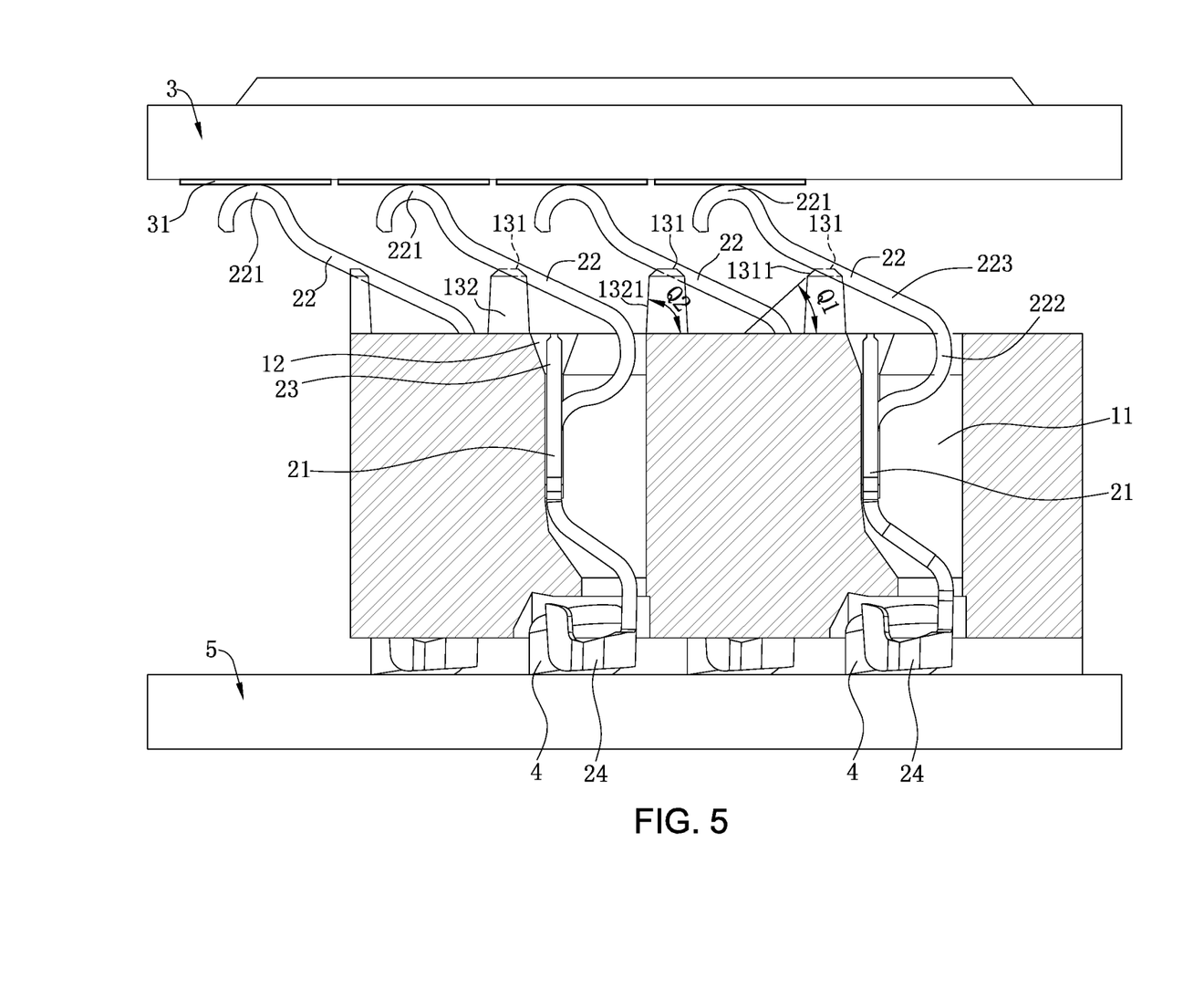
FIG. 5 is a side view of an electrical connector according to certain embodiments of the present application, where the electrical connector is not pressed by a chip module.

Referring to FIG. 1 and FIG. 5, an electrical connector 100 according to certain embodiments of the present application is used to be electrically connected to a chip module 3, which has multiple contact pads 31. The electrical connector 100 includes an insulating body 1, multiple conductive terminals 2 accommodated in the insulating body 1, and multiple supporting portions 13 used to abut the chip module 3.

Referring to FIG. 1, the insulating body 1 has multiple accommodating grooves 11 provided in a front and rear staggered arrangement, and two fastening slots 12 are concavely provided at two sides of each of the accommodating grooves 11 respectively.

Figure 2:
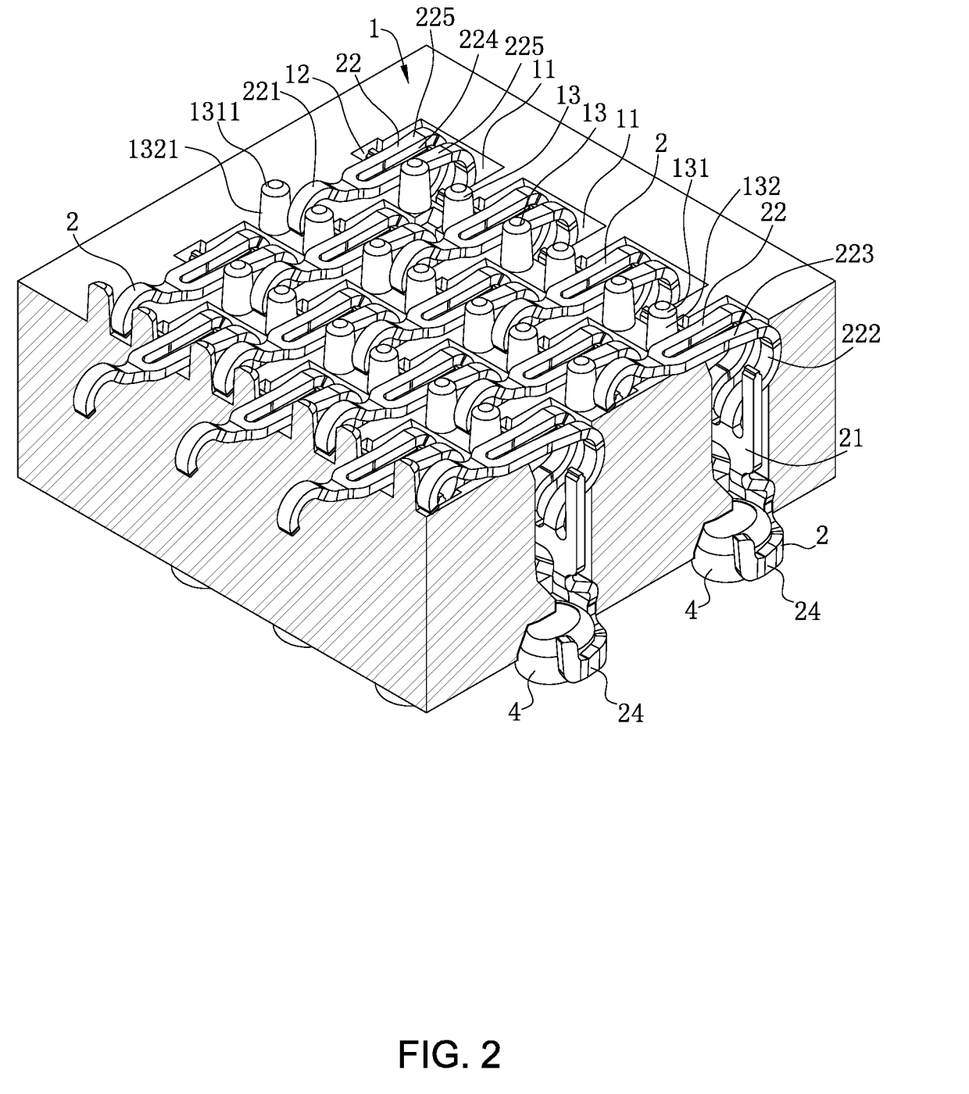
FIG. 2 is a perspective assembly view of an electrical connector according to certain embodiments of the present application.

Referring to FIG. 1, FIG. 2 and FIG. 5, the conductive terminals 2 are respectively accommodated in the accommodating grooves 11. Each of the conductive terminals 2 has a main body portion 21 located in the corresponding accommodating groove 11. One end of the main body portion 21 bends upward and extends to form an extending arm 22. One end of the extending arm 22 away from the main body portion 21 has a contact portion 221 which is arc-shaped, and the contact portion 221 is provided to be upward electrically connected to the corresponding contact pad 31. Two retaining portions 23 are provided to extend from the two sides of the main body portion 21 respectively and are located at two sides of the extending arm 22. The two retaining portions 23 are fastened in the two fastening slots 12 to prevent the conductive terminals 2 from moving downward. One end of the main body portion 21 away from the extending arm 22 has a clamping portion 24, and the clamping portion 24 clamps a solder ball 4 soldered to a circuit board 5 (as shown in FIG. 5). The extending arm 22 has a first portion 222 connected to the main body portion 21 and provided by bending forward, a second portion 223 extending forward from the first portion 222, and the contact portion 221 extending from the second portion 223 and being arc-shaped. The free end of the extending arm 22 is the arc-shaped tail end of the contact portion 221. A width of the first portion 222 is greater than a width of the second portion 223, and the width of the second portion 223 is greater than a width of the contact portion 221. In other words, the widths of the first portion 222, the second portion 223 and the contact portion 221 are in a descending order. The extending arm 22 further has a through hole 224 penetrating through a middle portion of the extending arm 22 vertically, and the through hole 224 extends from the second portion 223 to the first portion 222, thereby forming two elastic portions 225 respectively at a left side and a right side of the through hole 224. The through hole 224 provides a buffer space for each of the two elastic portions 225 to flexibly deform. The two elastic portions 225 are located between the contact portion 224 and the main body portion 21.

Figure 6:
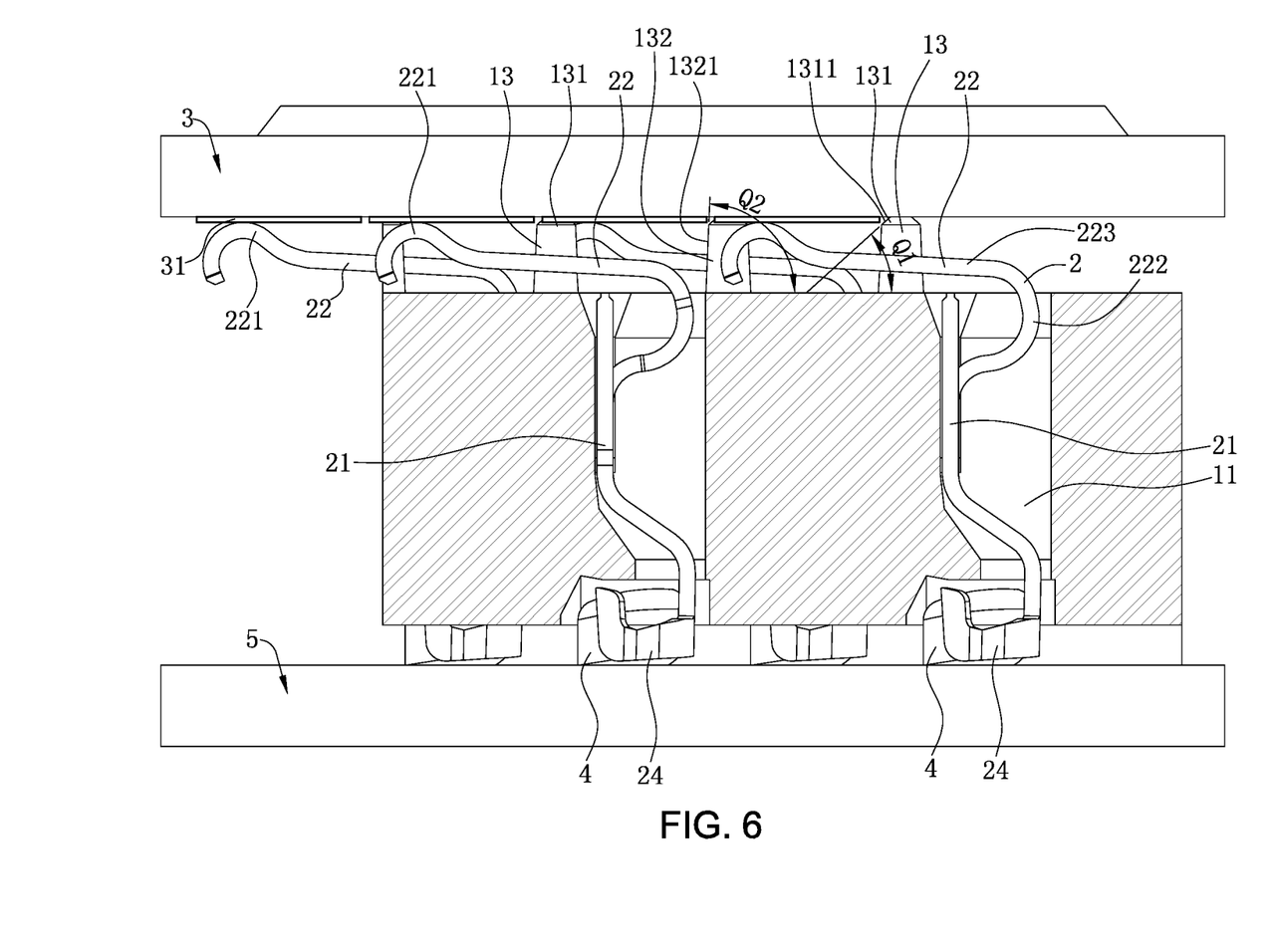
FIG. 6 is a side view of an electrical connector according to certain embodiments of the present application, where the electrical connector is pressed by a chip module.

Referring to FIG. 2 and FIG. 6, the supporting portions 13 are provided on an upper surface of the insulating body 1. One side of each of the accommodating grooves 11 has two supporting portions 13. A bottom end of each supporting portion 13 is connected with the insulating body 1. A first guide portion 131 protrudes and extends from a top end of each supporting portion 13, and a horizontal cross-section of the first guide portion 131 is circular shaped. A top surface of the first guide portion 131 is used to upward abut the chip module 3 to prevent the chip module 3 from excessively pressing the extending arm 22 to damage the conductive terminal 2. The first guide portion 131 has a first guide surface 1311 obliquely provided, and a first included angle Q1 is formed between the first guide surface 1311 and a top surface of the insulating body 1. A second guide portion 132 laterally protrudes from each supporting portion 13 and is located below the first guide portion 131, and a horizontal cross-section of the second guide portion 132 is also circular shaped. The second guide portion 132 has a second guide surface 1321 obliquely provided, and a second included angle Q2 is formed between the second guide surface 1321 and the top surface of the insulating body 1. The first included angle Q1 is greater than the second included angle Q2.

A width of the supporting portion 13 gradually decreases from the bottom end to the top end thereof. In other words, a diameter of a horizontal cross-section of the supporting portion 13 gradually decreases from the bottom end to the top end thereof. The second guide portion 132 and the first guide portion 131 are provided from the bottom end to the top end of the supporting portion 13, and a diameter of the second guide portion 132 is greater than a diameter of the first guide portion 131, such that the extending arms 22 of some of the conductive terminals 2 being deflected when being pressed by the chip module 3 can be pressed downward along the first guide portion 131 and the second guide portion 132, and the extending arms 22 are guided toward their correct positions (as shown in FIG. 3).

Figure 3:
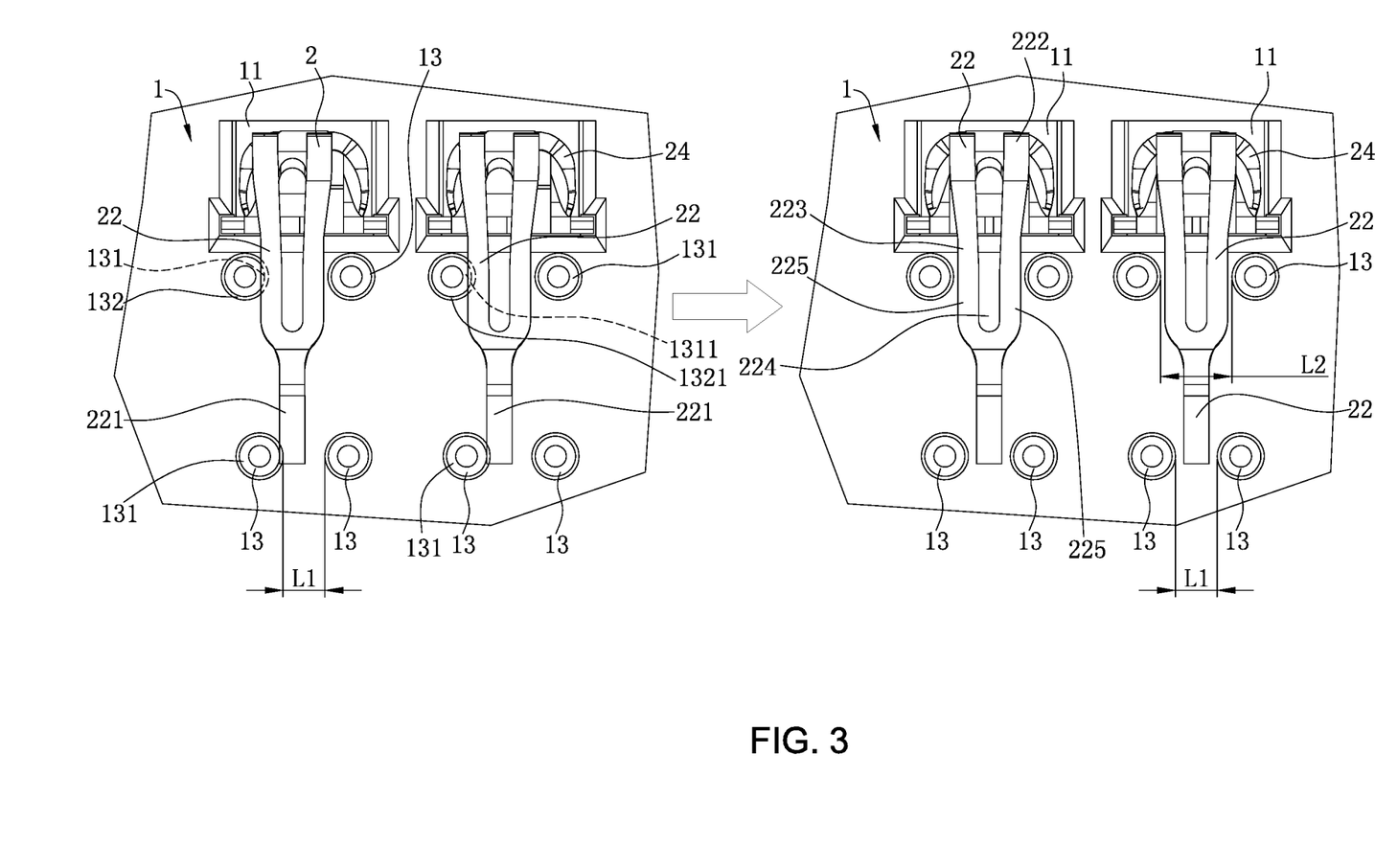
FIG. 3 is a schematic view of the electrical connector according to certain embodiments of the present application, where a guide portion guides an extending arm.

Referring to FIG. 3 and FIG. 5, from a side view, a vertical projection of the first guide surface 1311 partially overlaps with a vertical projection of the extending arm 22. Compared with the existing electrical connector without guide portions, in the electrical connector 100 according to certain embodiments of the present application, when the extending arm 22 is pressed by the chip module 3 to become deflected, the first guide portion 131 can guide the extending arm 22 to be pressed downward along the first guide surface 1311, such that the extending arm 22 returns to the correct position.

As shown in FIG. 3, from a top viewing angle, each second portion 223 has two supporting portions 13 at the left and right sides thereof, and a first distance L1 is defined between the two supporting portions 13 at the two sides of the second portion 223. The two second portion 223 located between the two supporting portions 13 are penetrated therethrough by the through hole 224, such that the two supporting portions 13 are correspondingly located at the left and right sides of the two elastic portions 225. Further, each contact portion 221 also has two supporting portions 13 at the left and right sides thereof, and a second distance L2 is defined between the two supporting portions 13 at the two sides of the contact portion 221. The second distance L2 is less than the first distance L1. When the extending arm 22 deflects leftward, a horizontal projection of the elastic portion 225 on the left side of the second portion 223 overlaps with a horizontal projection of the corresponding first guide portion 131, and a horizontal projection of the contact portion 221 does not overlap with each of the horizontal projections of the first guide portions 131 at its two sides. Since the extending arm 22 and the corresponding first guide portions 131 at its two sides are provided symmetrically (see FIG. 4), when the extending arm 22 deflects rightward, a horizontal projection of the elastic portion 225 on the right side of the second portion 223 overlaps with a horizontal projection of the corresponding first guide portion 131, and a horizontal projection of the contact portion 221 does not overlap with each of the horizontal projections of the first guide portions 131 at its two sides.

Figure 4:
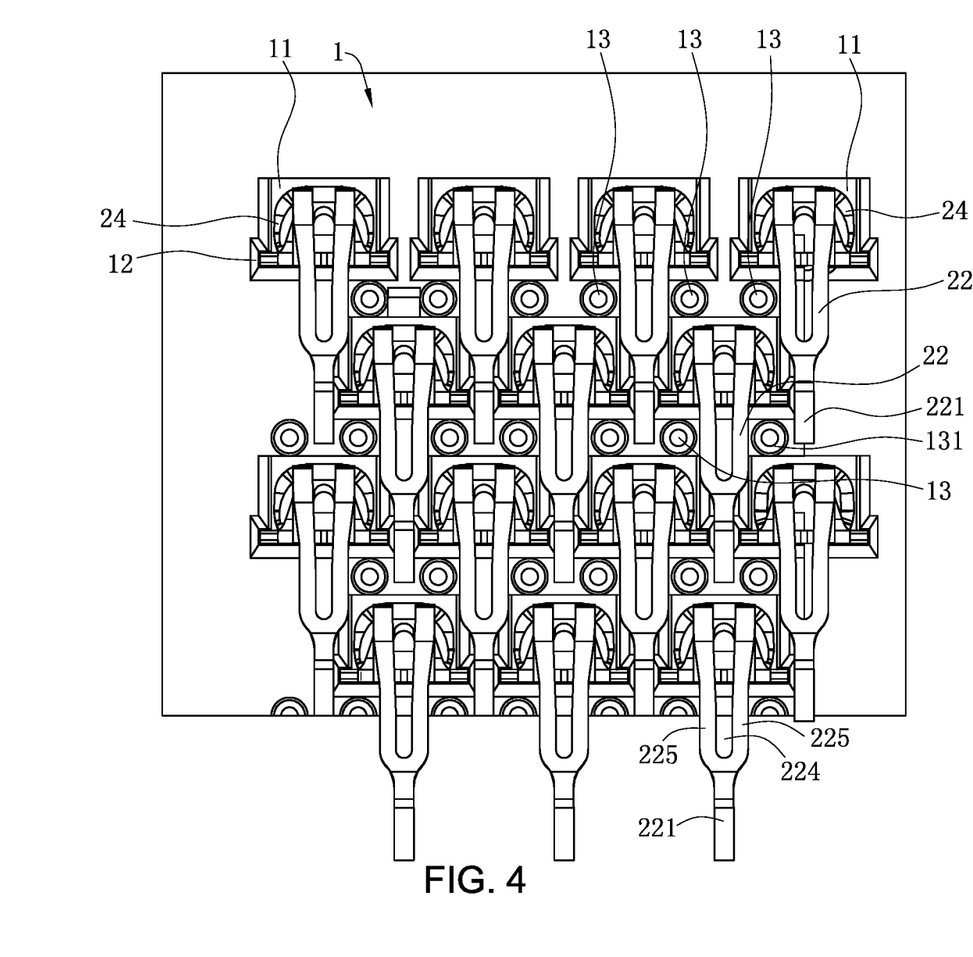
FIG. 4 is a top view of an electrical connector according to certain embodiments of the present application.

Referring to FIG. 4, a horizontal projection of the extending arm 22 is located between the two supporting portions 13. When the chip module 3 presses the extending arms 22 downward toward the insulating body 1, the extending arms 22 of some of the conductive terminals 2 will be deflected, and the horizontal projection of each of the defected extending arms 22 of these conductive terminal 2 partially overlap with the horizontal projection of the first guide surface 1311, such that the extending arm 22 is pressed downward along the first guide surface 1311 when being pressed, the first guide portion 131 stops the extending arm 22 from excessively moving laterally, and the first guide surface 1311 and the second guide surface 1321 guide the extending arm 22 to return to the correct position, so as to prevent the two adjacent conductive terminals 2 from contacting each other to cause short circuiting. The contact pad 31 presses the contact portion 221 downward until the chip module 3 abuts a top surface of the first guide portion 131. At this time, the top surface of the first guide portion 131 and the top surface of the contact portion 221 are at a same horizontal level, and the contact portion 221 is located between the two adjacent supporting portions 13 of the two adjacent accommodating grooves 11.

As shown in FIG. 6, when the chip module 3 downward presses the extending arms 22 until the first guide portions 131 upward abut the chip module 2, a vertical projection of the arc-shaped tail end of the contact portion 221 overlaps with a vertical projection of the second guide portion 132.

Figure 7:
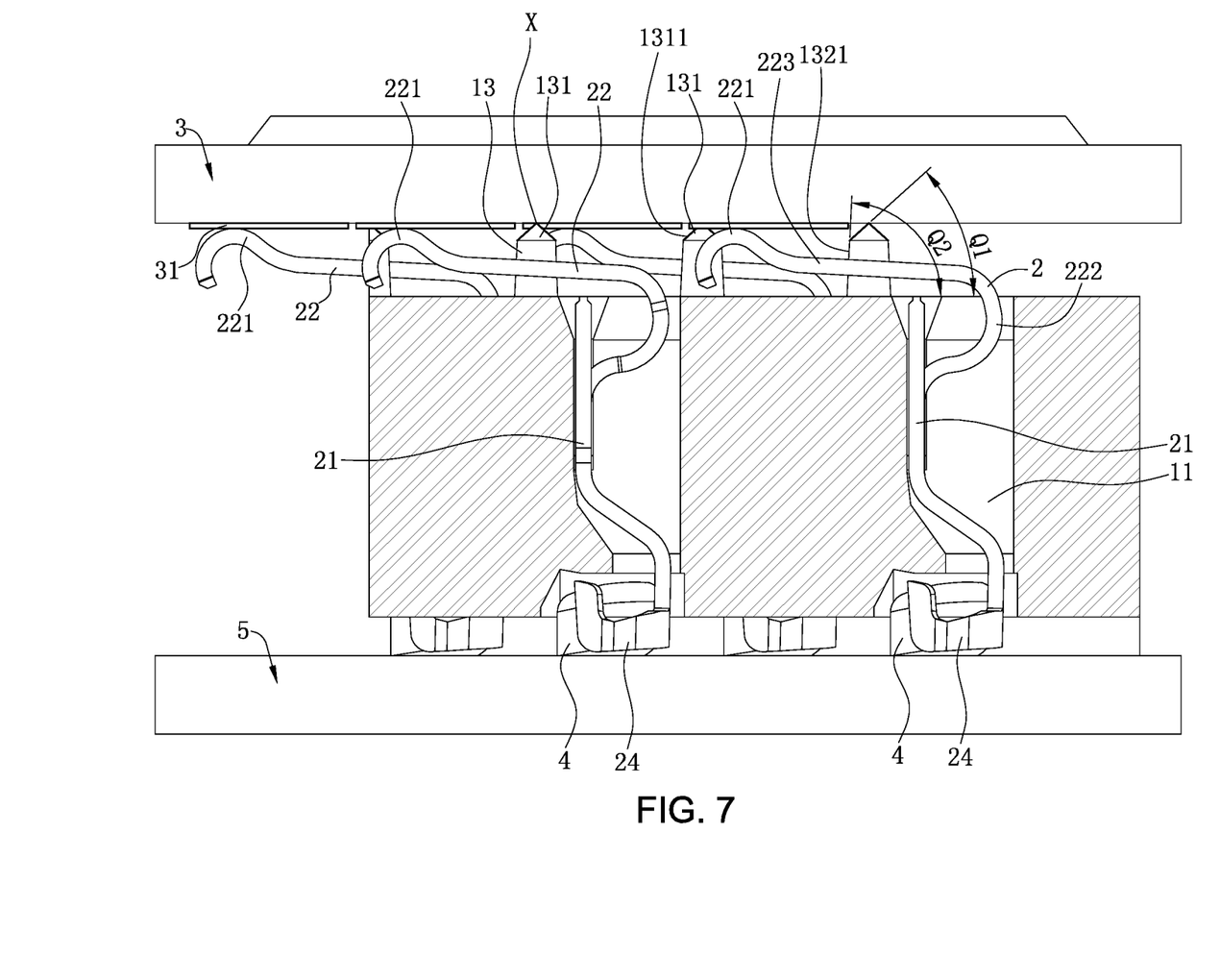
FIG. 7 is a schematic view of an electrical connector according to another embodiment of the present application.

As shown in FIG. 7, a second embodiment of the present application is different from a first embodiment in that one end of the first guide surface 1311 away from the second guide surface 1312 is converged to an intersection point X. That is, a top point of the first guide portion 131 abuts the chip module 3, such that a space occupied of the chip module 3 is small, without affecting the mating of each contact pad 31 on the chip module 3 and the contact portion 221.

To sum up, the electrical connector 100 according to certain embodiments of the present application has the following beneficial effects:

1. The electrical connector 100 is provided with multiple supporting portions 13 on the insulating body 1, and each supporting portion 13 is located at one side of one of the accommodating grooves 11. The first guide portion 131 protrudes and extends from the top end of each supporting portion 13. The horizontal projection of the extending arm 22 of each of some of the conductive terminals 2 partially overlaps with the horizontal projection of the first guide portion 131. Thus, the first guide portion 131 can support the chip module 3 to prevent the chip module 3 from excessively pressing the extending arms 22 to damage the conductive terminals 2. Meanwhile, in the process that the chip module 3 presses the extending arms 22, the first guide portion 131 can align the tilted conductive terminals 2 on the insulating body 1 and the deflected conductive terminals 2 occurred in the pressing process, so as to return the conductive terminals 2 to the correct positions, thus preventing two adjacent conductive terminals 2 from contacting each other to cause short circuiting.

2. From a side view, the vertical projection of the guide portion partially overlaps with the vertical projection of the extending arm 22. Compared with the existing electrical connector without guide portions, in the electrical connector 100 according to certain embodiments of the present application, when the extending arm 22 is pressed by the chip module 3 to become deflected, the first guide portion 131 can guide the extending arm 22 to be pressed downward along the first guide surface 1311, such that the extending arm 22 returns to the correct position.

3. The width of the supporting portion 13 gradually decreases from the bottom end to the top end thereof. The second guide portion 132 and the first guide portion 131 are provided sequentially from the bottom end to the top end of the supporting portion 13, such that the extending arms 22 of some of the conductive terminals 2 being deflected when being pressed by the chip module 3 can be pressed downward along the first guide surfaces 1311 and the second guide surfaces 1321, and the extending arms 22 are guided toward their correct positions.

4. When the chip module 3 presses the extending arms 22 downward toward the insulating body 1, the extending arms 22 of some of the conductive terminals 2 will be deflected, and the horizontal projection of each of the defected extending arms 22 of these conductive terminal 2 partially overlap with the horizontal projection of the first guide surface 1311, such that the extending arm 22 is pressed downward along the first guide surface 1311 when being pressed, the first guide surface 1311 stops the extending arm 22 from excessively moving laterally, and the first guide surface 1311 and the second guide surface 1321 guide the extending arm 22 to return to the correct position, so as to prevent the two adjacent conductive terminals 2 from contacting each other to cause short circuiting.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. An electrical connector, configured to be electrically connected to a chip module having a plurality of contact pads, the electrical connector comprising:
   an insulating body, having a plurality of accommodating grooves in a front and rear arrangement;
   a plurality of conductive terminals, respectively accommodated in the accommodating grooves, wherein each of the conductive terminals has a main body portion accommodated in a corresponding one of the accommodating grooves and an extending arm extending forward from an upper end of the main body portion, and each of the extending arms of the conductive terminals is configured to be upward electrically connected to a corresponding one of the contact pads; and
   at least one supporting portion, provided on the insulating body and located at one side of a corresponding one of the accommodating grooves, wherein a first guide portion protrudes and extends from a top end of the supporting portion, a horizontal cross-section of the first guide portion is circular shaped, and the first guide portion is configured to upward abut the chip module; wherein when the extending arm is deflected, a horizontal projection of the extending arm of at least one of the conductive terminals partially overlaps with a horizontal projection of the first guide portion; wherein the first guide portion has a first guide surface obliquely provided, a first included angle is formed between the first guide surface and a top surface of the insulating body, the supporting portion comprises a second guide portion that laterally protrudes and extends therefrom, the second guide portion is located below the first guide portion, a horizontal cross-section of the second guide portion is circular shaped, the second guide portion has a second guide surface obliquely provided, a second included angle is formed between the second guide surface and the top surface of the insulating body, and the first included angle is less than the second included angle.

2. The electrical connector according to claim 1, wherein a bottom end of the supporting portion is connected with the insulating body, the second guide portion and the first guide portion are provided from the bottom end to the top end of the supporting portion, and a diameter of the supporting portion gradually decreases from the bottom end toward the top end.

3. The electrical connector according to claim 1, wherein one end of the first guide surface away from the second guide surface is converged to an intersection point, and the intersection point upward abuts the chip module.

4. The electrical connector according to claim 1, wherein when the extending arm is deflected, a vertical projection of the second guide surface partially overlaps with the extending arm.

5. The electrical connector according to claim 1, wherein one end of the extending arm away from the main body portion has a contact portion being arc-shaped, the contact portion is configured to upward abut the corresponding one of the contact pads, the supporting portion comprises a second guide portion that laterally protrudes and extends therefrom, the second guide portion is located below the first guide portion, and when the first guide portion upward abuts the chip module, a vertical projection of an tail end of the arc-shaped contact portion overlaps with a vertical projection of the second guide portion.

6. The electrical connector according to claim 5, wherein when the chip module presses the extending arm downward toward the insulating body, the corresponding one of the contact pads presses the contact portion downward until the chip module abuts a top surface of the first guide portion.

7. The electrical connector according to claim 1, wherein when the chip module presses the extending arm downward toward the insulating body, the first guide portion stops the extending arm from excessively moving laterally.

8. The electrical connector according to claim 1, wherein two fastening slots are concavely provided at two sides of each of the accommodating grooves respectively, two retaining portions are provided to extend upward from two sides of the main body portion respectively and are located at two sides of the extending arm, and the two retaining portions are correspondingly fastened in the two fastening slots.

9. An electrical connector, configured to be electrically connected to a chip module having a plurality of contact pads, the electrical connector comprising:

an insulating body, having a plurality of accommodating grooves in a front and rear arrangement;
a plurality of conductive terminals, respectively accommodated in the accommodating grooves, wherein each of the conductive terminals has a main body portion accommodated in a corresponding one of the accommodating grooves and an extending arm extending forward from an upper end of the main body portion, the extending arm has a through hole penetrating therethrough, two elastic portions are formed at a left side and a right side of the through hole, and each of the extending arms of the conductive terminals is configured to be upward electrically connected to a corresponding one of the contact pads; and
at least one supporting portion, provided on the insulating body and located at one side of a corresponding one of the accommodating grooves, wherein a first guide portion protrudes and extends from a top end of the supporting portion, and the first guide portion is configured to upward abut the chip module;
wherein when the extending arm is deflected, a horizontal projection of the two elastic portions of at least one of the conductive terminals partially overlaps with a horizontal projection of the first guide portion; wherein the first guide portion has a first guide surface obliquely provided, a first included angle is formed between the first guide surface and a top surface of the insulating body, the supporting portion comprises a second guide portion that laterally protrudes and extends therefrom, the second guide portion is located below the first guide portion, the second guide portion has a second guide surface obliquely provided, a second included angle is formed between the second guide surface and the top surface of the insulating body, and the first included angle is less than the second included angle.

10. The electrical connector according to claim 9, wherein when the extending arm is deflected, a vertical projection of the second guide surface partially overlaps with the extending arm.

11. The electrical connector according to claim 9, comprising two supporting portions, wherein the two supporting portions are located at a same side of the extending arm in a left-right direction, one end of the extending arm away from the main body portion has a contact portion being arc-shaped, the contact portion is configured to upward abut the corresponding one of the contact pads, the contact portion is located closer to the one end of the extending arm than the elastic portions, one of the two supporting portions is correspondingly provided at one side of the two elastic portions, the other of the two supporting portions is correspondingly provided at one side of the contact portion, and when the horizontal projection of the two elastic portions overlaps with the horizontal projection of the first guide portion, a horizontal projection of the contact portion does not overlap with the horizontal projection of the first guide portion.

12. The electrical connector according to claim 11, comprising four supporting portions formed in two pairs in the left-right direction, wherein two supporting portions in one of the two pairs of the supporting portions are located at a left side and a right side of the two elastic portions, a first distance is defined between the two supporting portions in the one of the two pairs of the supporting portions, two supporting portions in the other of the two pairs of the supporting portions are located at a left side and a right side of the contact portion, a second distance is defined between the two supporting portions in the other of the two pairs of the supporting portions, and the first distance is greater than the second distance.

13. The electrical connector according to claim 9, wherein two fastening slots are concavely provided at two sides of each of the accommodating grooves respectively, two retaining portions are provided to extend upward from two sides of the main body portion respectively and are located at two sides of the extending arm, and the two retaining portions are correspondingly fastened in the two fastening slots.

14. An electrical connector, configured to be electrically connected to a chip module having a plurality of contact pads, the electrical connector comprising:
    an insulating body, having a plurality of accommodating grooves in a front and rear arrangement;
    a plurality of conductive terminals, respectively accommodated in the accommodating grooves, wherein each of the conductive terminals has a main body portion accommodated in a corresponding one of the accommodating grooves and an extending arm extending forward from an upper end of the main body portion, the extending arm has, sequentially forward from rear thereof, a first portion, a second portion and a contact portion, widths of the first portion, the second portion and the contact portion are in a descending order, the first portion is provided in a bending manner, the contact portion is electrically connected to the chip module, the second portion connects the first portion to the contact portion, and each of the extending arms of the conductive terminals is configured to be upward electrically connected to a corresponding one of the contact pads; and
    at least one supporting portion, provided on the insulating body and located at one side of a corresponding one of the accommodating grooves, wherein a first guide portion protrudes and extends from a top end of the supporting portion, and the first guide portion is configured to upward abut the chip module;
    wherein when the extending arm is deflected, a horizontal projection of the extending arm of at least one of the conductive terminals partially overlaps with a horizontal projection of the first guide portion; wherein the first guide portion has a first guide surface obliquely provided, and a first included angle is formed between the first guide surface and a top surface of the insulating body, the supporting portion comprises a second guide portion that laterally protrudes and extends therefrom, the second guide portion is located below the first guide portion, the second guide portion has a second guide surface obliquely provided, a second included angle is formed between the second guide surface and the top surface of the insulating body, and the first included angle is less than the second included angle.

15. The electrical connector according to claim 14, wherein when the extending arm is deflected, a vertical projection of the second guide surface partially overlaps with the extending arm.

16. The electrical connector according to claim 14, comprising two supporting portions, wherein the two supporting portions are located at a same side of the extending arm in a left-right direction, one of the two supporting portions is correspondingly provided at one side of the second portion, the other of the two supporting portions is correspondingly provided at one side of the contact portion, and when a horizontal projection of the second portion overlaps with the horizontal projection of the first guide portion, a horizontal projection of the contact portion does not overlap with the horizontal projection of the first guide portion.

17. The electrical connector according to claim 16, comprising four supporting portions formed in two pairs in the left-right direction, wherein two supporting portions in one of the two pairs of the supporting portions are located at a left side and a right side of the second portion, a first distance is defined between the two supporting portions in the one of the two pairs of the supporting portions, two supporting portions in the other of the two pairs of the supporting portions are located at a left side and a right side of the contact portion, a second distance is defined between the two supporting portions in the other of the two pairs of the supporting portions, and the first distance is greater than the second distance.

* * * * *